United States Patent
Kim

(10) Patent No.: US 6,406,949 B1
(45) Date of Patent: *Jun. 18, 2002

(54) THIN FILM TRANSISTOR-LIQUID CRYSTAL DISPLAY AND MANUFACTURING METHOD THEREFOR

(75) Inventor: Dong-Gyu Kim, Kyungki-do (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 37 days.

(21) Appl. No.: 08/600,132

(22) Filed: Feb. 12, 1996

(30) Foreign Application Priority Data

Feb. 11, 1995 (KR) ............................................. 95-2509

(51) Int. Cl.[7] ......................... H01L 21/00; H01L 21/84
(52) U.S. Cl. ....................... 438/159; 438/30; 438/158; 438/160; 438/161
(58) Field of Search ........................ 438/30, 158, 159, 438/160, 161; 257/59; 349/42, 43, 149, 151, 152

(56) References Cited

U.S. PATENT DOCUMENTS

| | | | | |
|---|---|---|---|---|
| 5,045,485 A | * | 9/1991 | Tanaka et al. ............... 438/458 |
| 5,054,887 A | * | 10/1991 | Kato et al. | |
| 5,166,085 A | * | 11/1992 | Wakai et al. | |
| 5,366,912 A | * | 11/1994 | Kobayashi | |
| 5,397,719 A | * | 3/1995 | Kim et al. ................... 438/158 |
| 5,422,293 A | * | 6/1995 | Konya ........................ 438/30 |
| 5,478,766 A | * | 12/1995 | Park et al. .................... 438/30 |
| 5,483,082 A | * | 1/1996 | Takizawa et al. ............. 257/59 |
| 5,496,749 A | * | 3/1996 | Nasu et al. ................... 438/30 |
| 5,580,796 A | * | 12/1996 | Takizawa et al. | |
| 5,705,411 A | * | 1/1998 | Yamanobe et al. | |

FOREIGN PATENT DOCUMENTS

JP 6-118444 * 4/1994

* cited by examiner

Primary Examiner—Long Pham
Assistant Examiner—Scott A Blairton
(74) Attorney, Agent, or Firm—Pillsbury Winthrop LLP

(57) ABSTRACT

This invention relates to a TFT-LCD and a manufacturing method therefor which etches triple layer patterns in a single process step. As a result, the number of masking processes is reduced and a high quality device is produced with less defects. The method comprises the steps of: depositing a gate metal on a substrate; forming and a gate pad a gate electrode by etching the gate metal; forming an insulating layer on both the gate metal and the gate pad; depositing an amorphous silicon layer on the insulating layer; depositing an n+ amorphous silicon layer on the amorphous silicon layer; depositing a source/drain on the n+ amorphous silicon layer; etching the amorphous silicon, the n+ amorphous silicon layer and the source/drain to form a triple layer pattern; etching the n+ amorphous silicon layer and the source/drain to form a source/drain electrode; depositing a passivation layer; etching a passivation layer to expose both a portion of the source/drain electrode and a portion of the gate pad; depositing a pixel electrode layer on the passivation layer; and etching the pixel electrode layer to form a pixel electrode.

5 Claims, 8 Drawing Sheets

THIN FILM TRANSISTOR-LIQUID CRYSTAL DISPLAY AND MANUFACTURING METHOD THEREFOR

BACKGROUND OF THE INVENTION

1. Field of the Invention

The present invention relates to a thin film transistor-liquid crystal display (hereinafter referred to as a TFT-LCD) and a manufacturing method therefor. More particularly, this invention relates to a TFT-LCD and a manufacturing method therefor which etches multi-layer patterns in a single process step.

2. Description of the Related Art

A conventional TFT-LCD is disclosed in Society for Information Display '94 DIGEST, page 263, the content of which is hereby expressly incorporated by reference herein in its entirety. That TFT-LCD will now be described with reference to FIGS. 1, 2A–2H, and 3A–3H.

In FIG. 1, a conventional TFT-LCD is depicted which comprises: a substrate 1, a gate electrode 2, an anodic oxidation layer 3, an insulating layer 4, an amorphous silicon layer 5, an n+ amorphous silicon layer 6, a source/drain electrode 9, a passivation layer 10, and a pixel electrode layer 13.

FIGS. 2A–2H show several cross-sectional views depicting different stages of a fabrication sequence for the conventional TFT-LCD shown in FIG. 1. FIGS. 3A–3H show cell. views of layouts corresponding to the steps illustrated in FIGS. 2A–2H, respectively. Some layers are omitted from the cell layout views of FIGS. 3A–3H for purposes of simplification. Referring to those figures, a conventional method for fabricating a TFT-LCD generally comprises the steps of:

forming a gate pad 21, a gate electrode 2, and a gate line by depositing and etching a metal layer on a substrate 1;

forming a anodic oxidation layer 3 on both the gate electrode 2 and a portion of the gate pad 21;

depositing an insulating layer 4;

depositing an amorphous silicon layer 5 on the insulating layer 4;

depositing an n+ amorphous silicon layer 6 on the amorphous silicon layer 5;

etching both the amorphous silicon layer 5 and the n+ amorphous silicon layer 6 to form an active island 56;

partially etching the insulating layer 4 on the gate pad 21;

forming both a source/drain electrode 9 and a data line by depositing and etching a metal layer;

forming a passivation layer 10 having a contact hole 12 by depositing and etching an insulating material; and forming a pixel electrode 13 by depositing and etching a transparent conductive material.

The above-described conventional TFT-LCD has many problems.

First, it reduces production yield. In addition, the etchants used during the etching process steps cause defects in the resulting TFT-LCD.

Moreover, it is more costly because many etching processes are employed in its fabrication.

SUMMARY OF THE INVENTION

An objective of the present invention is to provide a TFT-LCD and a manufacturing method therefor which etches multi-layer patterns in a single process step. Accordingly, the present invention not only reduces the number of masking processes but also produces a high quality device with less defects.

In order to achieve this objective, a method is provided for manufacturing a TFT-LCD according to the present invention, which comprises the steps of:

depositing a gate metal on a substrate;

forming a gate electrode and a gate pad by etching the gate metal;

depositing an insulating layer;

depositing an amorphous silicon layer;

depositing an n+ amorphous silicon layer on the amorphous silicon layer.

depositing a source/drain layer on the n+ amorphous silicon layer;

etching the source/drain layer, the n+ amorphous silicon layer, and the amorphous silicon layer to form a triple layer pattern in a single process step;

etching the source/drain layer and the n+ amorphous silicon layer to form a source/drain electrode pattern;

depositing a passivation layer;

etching a passivation layer to expose both a portion of the source/drain electrode and a portion of the gate pad;

depositing a pixel electrode on the passivation layer; and etching the pixel electrode;

A TFT-LCD according to the present invention includes: a gate electrode and a gate pad that are formed on a substrate; an insulating layer having a contact hole exposing the gate pad; an amorphous silicon layer which is formed on the insulating layer; a source/drain electrode which is formed on the amorphous silicon layer; a passivation layer, having contact holes which are formed on both the source/drain electrode and the gate pad; and a pixel electrode layer formed on the passivation layer.

BRIEF DESCRIPTION OF THE DRAWINGS

The present invention will now be described more specifically with reference to the attached drawings, wherein.

DESCRIPTION OF THE PREFERRED EMBODIMENT

A preferred embodiment of the present invention will become apparent from a study of the following detailed description, when viewed in light of the accompanying drawings.

Figure 1:
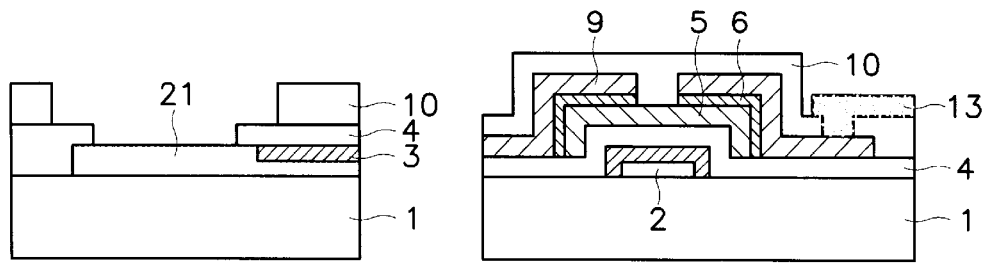
FIG. 1 shows a conventional TFT-LCD.
Figure 2A:
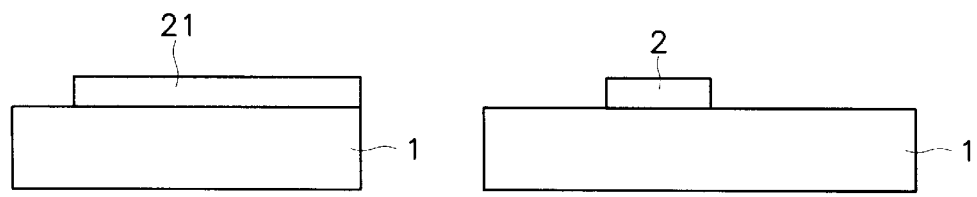
FIGS. 2A–2H show cross sectional views depicting a fabrication sequence for producing a conventional TFT-LCD.
Figure 2B:
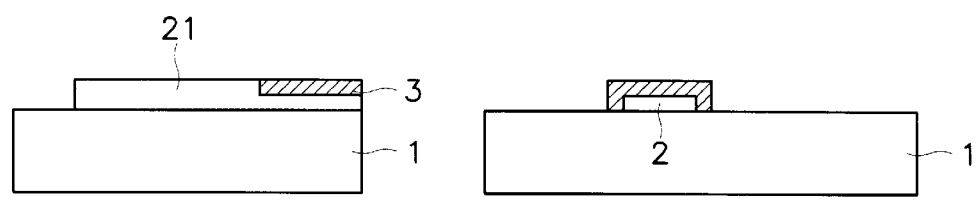
Figure 2C:
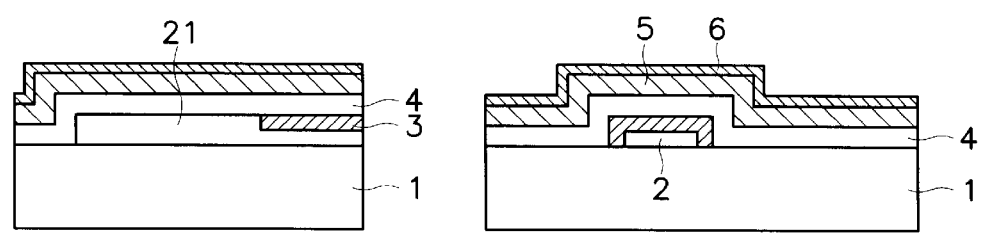
Figure 2D:
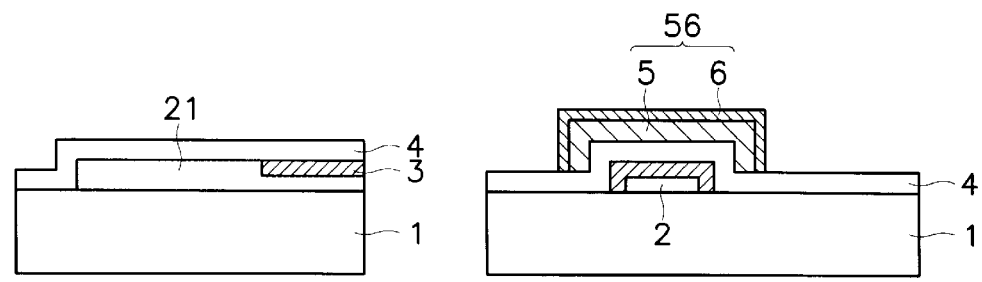
Figure 2E:
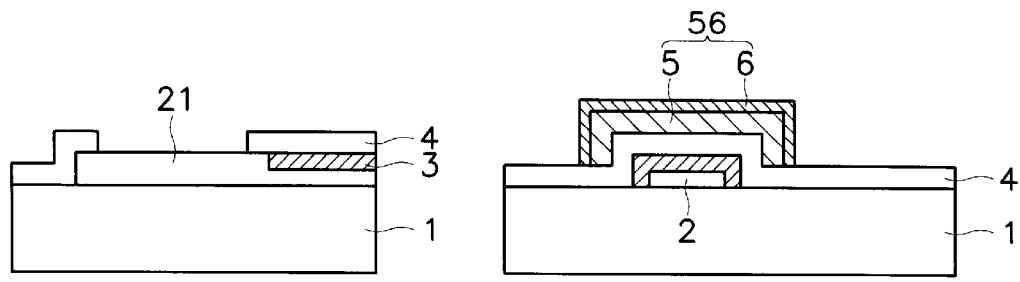
Figure 2F:
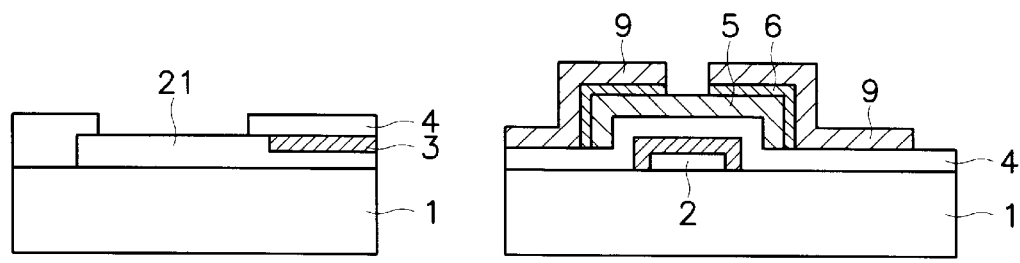
Figure 2G:
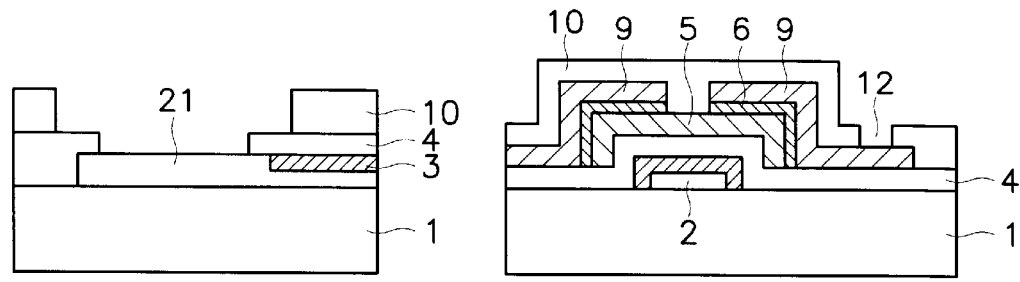
Figure 2H:
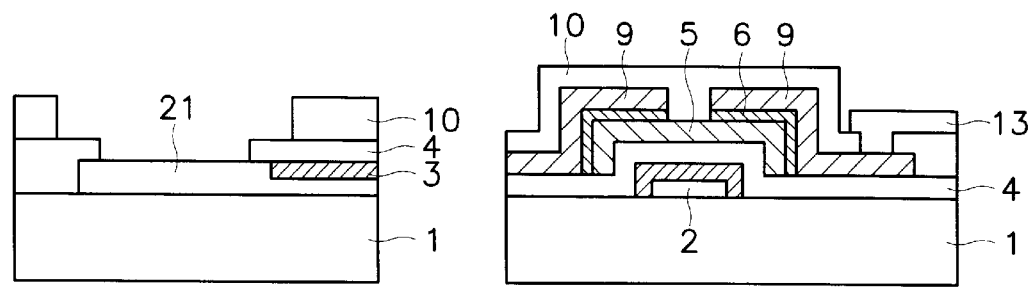
Figure 3A:
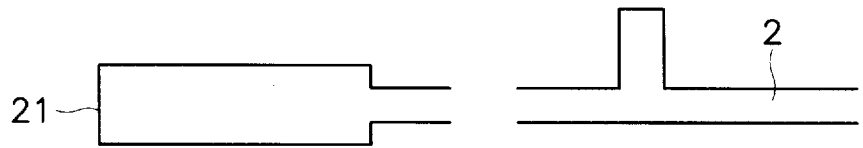
FIGS. 3A–3H show cell layout views depicting the steps as illustrated in FIGS. 2A–2H respectively.
Figure 3B:
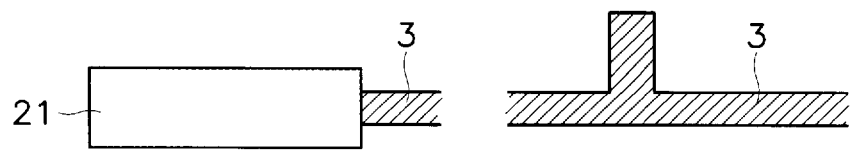
Figure 3C:
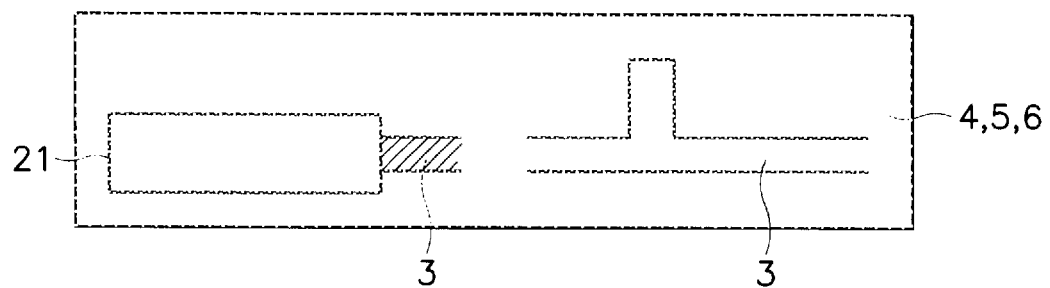
Figure 3D:
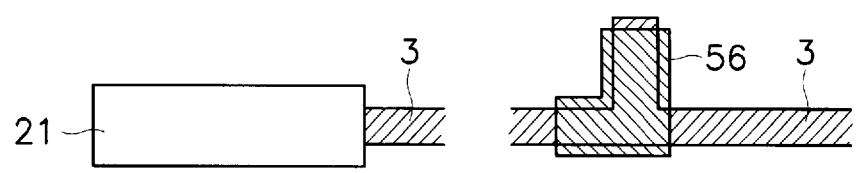
Figure 3E:
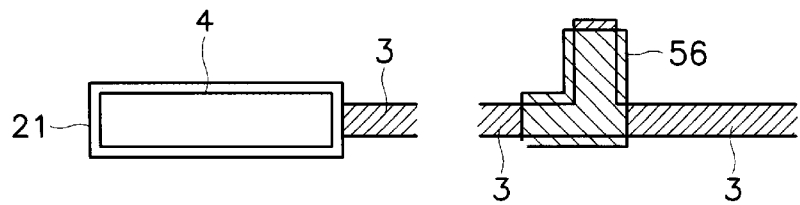
Figure 3F:
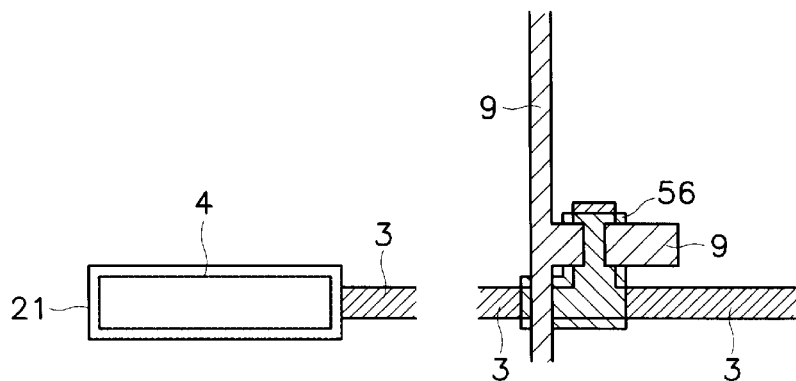
Figure 3G:
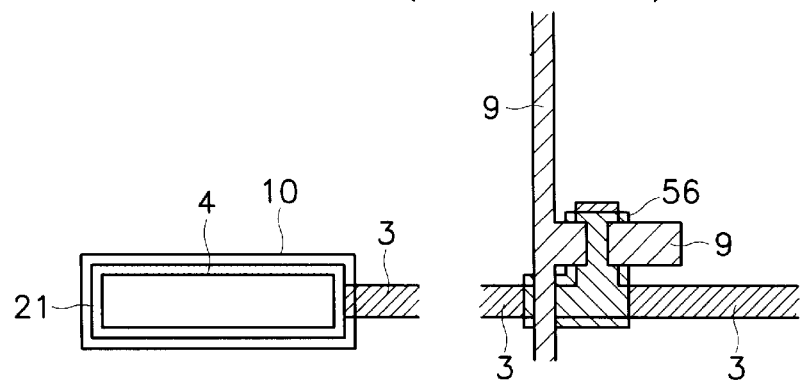
Figure 3H:
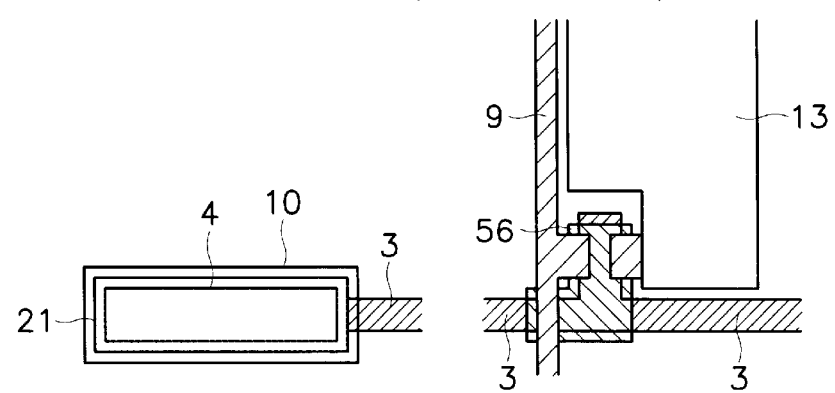
Figure 4:
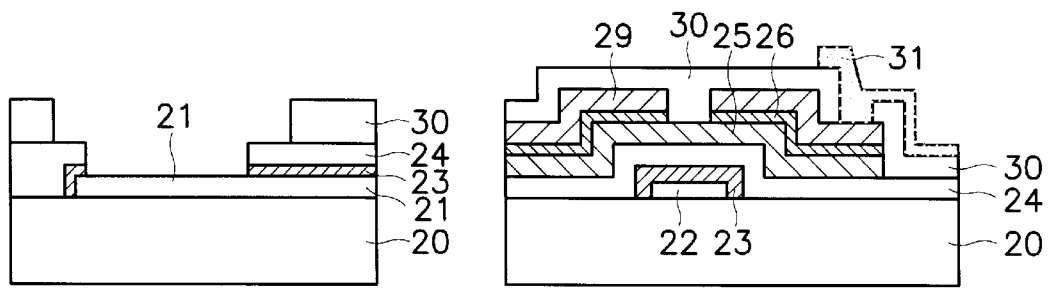
FIG. 4 shows a TFT-LCD according to a preferred embodiment of the present invention.

FIG. 4 shows a TFT-LCD according to a preferred embodiment of the present invention. A gate electrode 22 and a gate pad 21 are provided, each formed on a substrate 20. An anodic oxidation layer 23 is provided which is formed on both the gate electrode 22 and the gate pad 21. An insulating layer 24 is deposited on the anodic oxidation layer 23, and comprises a contact hole exposing the gate pad 21. An amorphous silicon layer 25 is formed on the insulating layer 24. A source/drain electrode 29 is formed on the amorphous silicon layer 25. A passivation layer 30 made of insulating material is formed on the source/drain electrode 29 and has a contact hole exposing the gate pad 21.

A manufacturing method for producing a TFT-LCD according to a preferred embodiment of the present invention is shown in FIGS. 5A–5H and 6A–6H. FIGS. 5A–5H show cross-sectional side views of the device during various fabrication stages, and FIGS. 6A–6H show corresponding cell layout views. Some layers are omitted from the cell layout views of FIGS. 6A–6H for purposes of simplification.

Figure 5A:
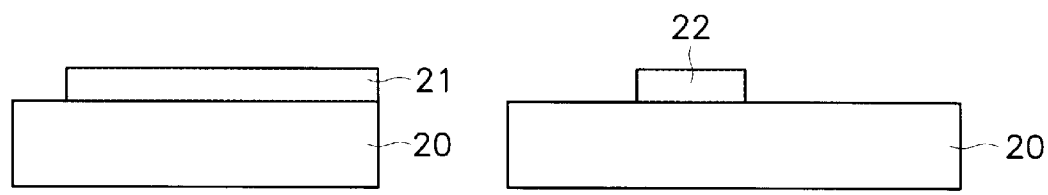
FIGS. 5A–5G are cross sectional views showing sequential steps of a method of producing the TFT-LCD of FIG. 4.
Figure 6A:
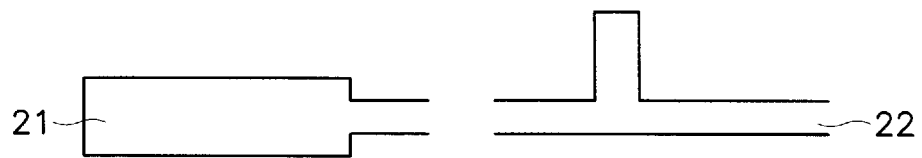
FIGS. 6A–6G are cell layout views of the steps as illustrated in FIGS. 5A–5G.

As shown in FIGS. 5A and 6A, a gate metal is deposited on a substrate 20. Then, the gate electrode 22 and the gate pad 21 are formed by etching the gate metal.

Figure 5B:
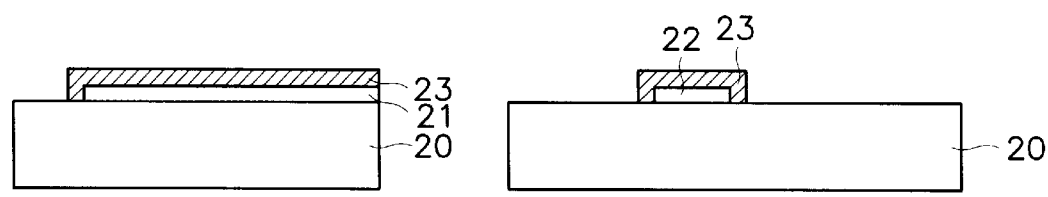
Figure 6B:
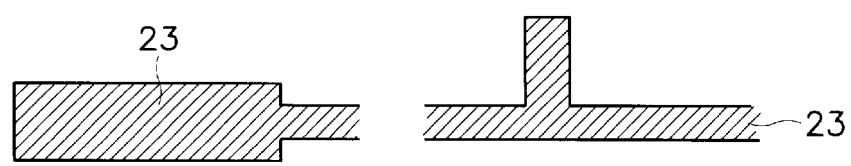

As shown in FIG. 5B and FIG. 6B, an anode oxidation layer 23 is formed on both the gate electrode 22 and the gate pad 21.

Figure 5C:
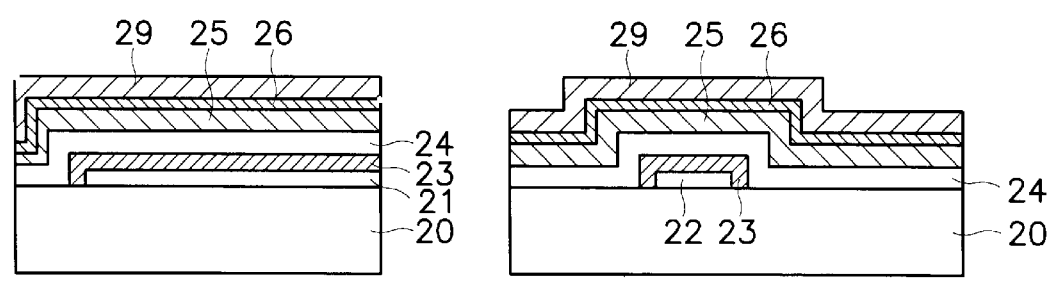
Figure 6C:
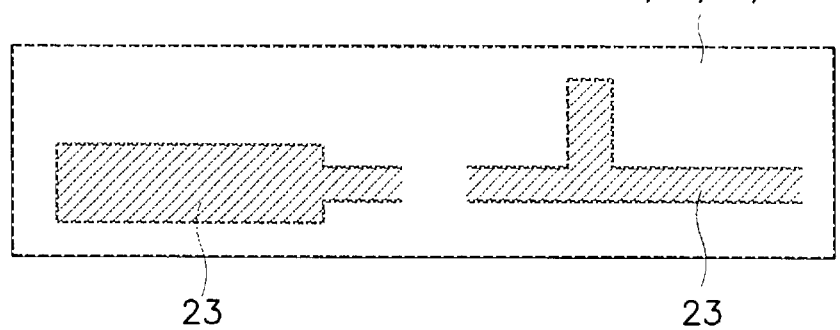

As shown in FIG. 5C and FIG. 6C, an insulating layer 24 is then deposited on the anode oxidation layer 23. Then an amorphous silicon layer 25 is deposited on the insulating layer 24. Then an n+ amorphous silicon layer 26 is deposited on the amorphous silicon layer 25. Then a source/drain electrode metal 29 is deposited on the n+ amorphous silicon layer 25.

Figure 5D:
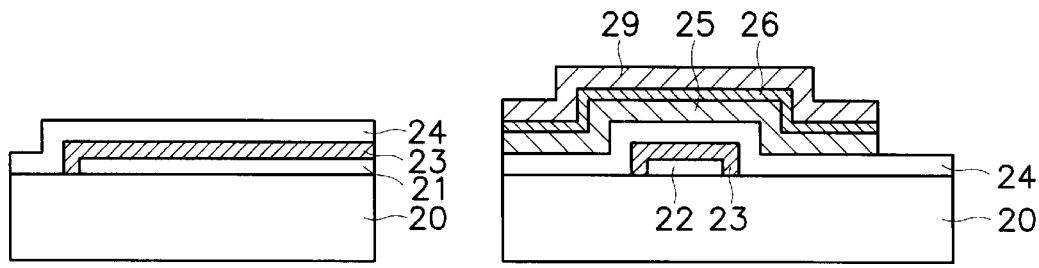
Figure 6D:
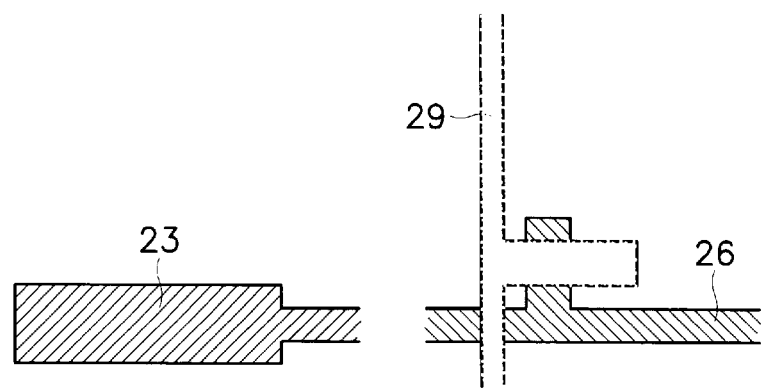

As shown in FIG. 5D and FIG. 6D, the source/drain 29, the n+ amorphous silicon layer 26 and the amorphous silicon 25 are etched to form a triple layer pattern.

Figure 5E:
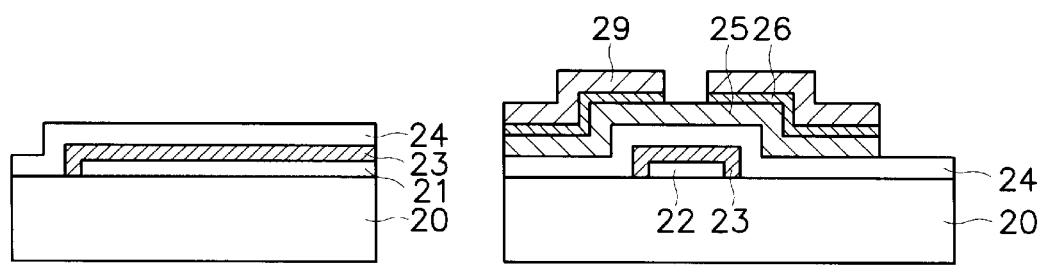
Figure 6E:
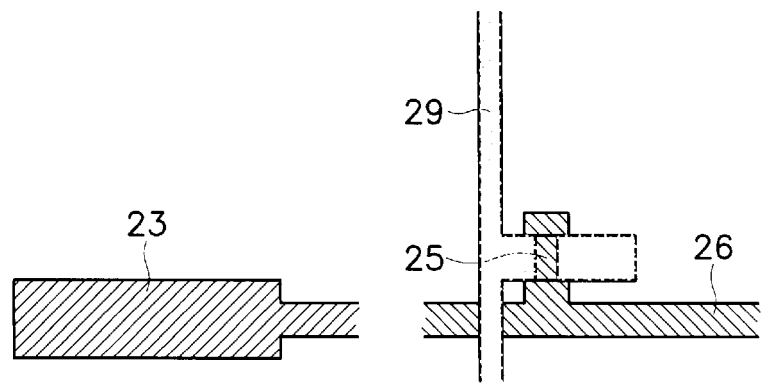

As shown in FIG. 5E and FIG. 6E, the-source/drain 29 and the n+ amorphous silicon layer 26 are etched to form a source/drain pattern, partially exposing amorphous silicon layer 25.

Figure 5F:
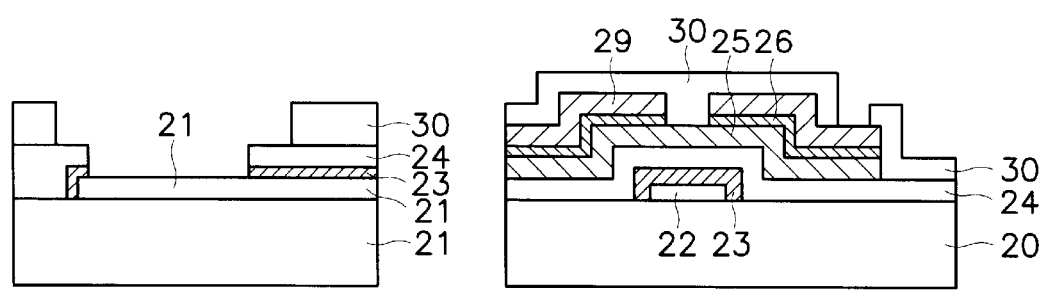
Figure 6F:
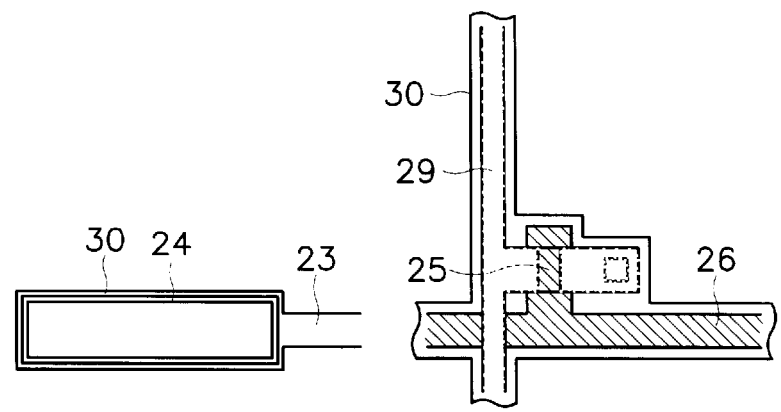

As shown in FIGS. 5F and 6F, a passivation layer 30 is deposited on the source/drain 29 and the gate pad 21. Then, the passivation layer 30 is etched, together with portions of anode oxidation layer 23 and insulating layer 24, to expose both a portion of the source/drain 29 and a portion of the gate pad 21.

At this time, when both the insulating layer 24 and the anodic oxidation layer 23 on the gate pad 21 are partially etched, portions of the insulating layer 24 and the anodic oxidation layer 23 which are on the gate electrode 22 are protected from the etchant because they are covered with the source/drain layer 29.

Figure 5G:
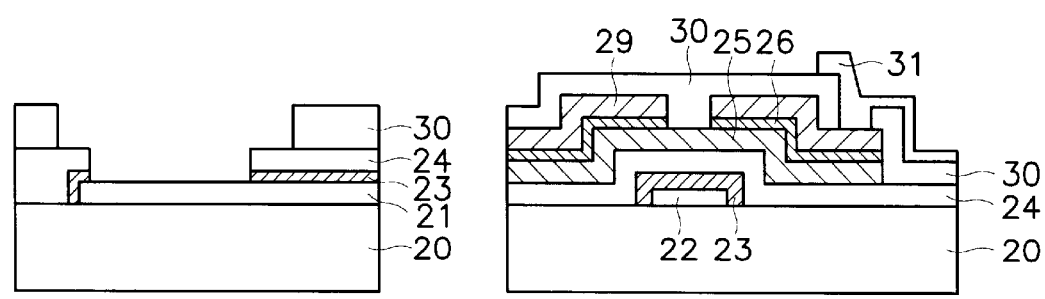
Figure 6G:
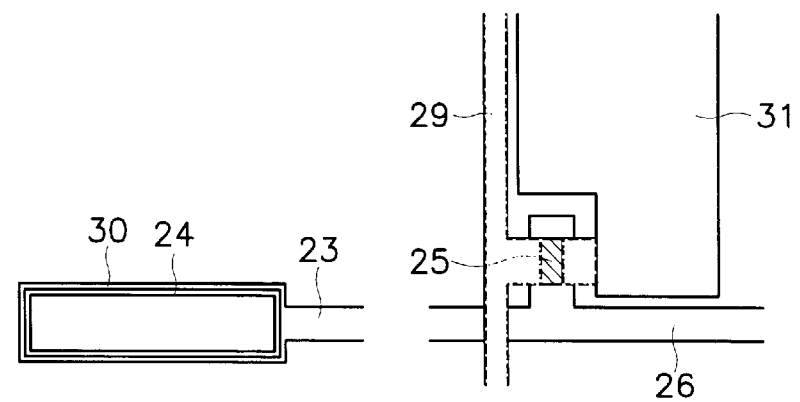

As shown in FIG. 5G and FIG. 6G, a pixel electrode 31 is deposited on the passivation layer 30. Then a pixel electrode pattern is etched.

As described above, this invention not only reduces steps of the masking process but also producing a high quality device with less defects.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for manufacturing a thin film transistor-liquid crystal display, comprising the steps of:

depositing a gate metal on a substrate;

forming a gate electrode by etching said gate metal;

depositing an insulating layer on said gate electrode;

depositing an amorphous silicon layer on said insulating layer;

depositing an n+ amorphous silicon layer on said amorphous silicon layer;

depositing a source/drain metal layer on said n+ amorphous silicon layer;

simultaneously etching the three layers of said source/drain metal layer, n+ amorphous silicon layer and said amorphous silicon layer until said insulating layer is exposed to form a triple layer pattern;

etching said source/drain electrode metal layer and n+amorphous silicon layer to form a separated source/drain electrode pattern and expose a portion of said amorphous silicon layer between the source and drain electrodes; and depositing a passivation layer covering said exposed portion of said amorphous silicon layer and said exposed portion of said insulating layer.

2. A method according to claim 1, further comprising the step of forming an anode oxidation layer between said gate electrode and said insulating layer.

3. A method according to claim 1, wherein said step of etching said source/drain layer, n+ amorphous silicon layer and said amorphous silicon layer comprises a single photolithography process of concurrently etching said source/drain layer, n+ amorphous silicon layer and said amorphous silicon layer.

4. The method as defined in claim 1, further comprising the steps of:

etching said passivation layer to expose at least a portion of said source/drain electrode;

depositing a pixel electrode layer on said passivation layer; and etching said pixel electrode layer to form a pixel electrode electrically contacted to a portion of said exposed source/drain electrode.

5. The method as defined in claim 4, further comprising the step of forming a gate pad along with said gate electrode, wherein said passivation layer is etched on said gate pad along with said insulating layer when etching said passivation layer.

* * * * *